United States Patent [19]

Ballato et al.

[11] 4,311,938
[45] Jan. 19, 1982

[54] METHOD OF SWEEPING QUARTZ

[75] Inventors: Arthur Ballato, Long Branch; John R. Vig, Colts Neck, both of N.J.

[73] Assignee: The United States of America as represented by the Secretary of the Army, Washington, D.C.

[21] Appl. No.: 148,114

[22] Filed: May 9, 1980

[51] Int. Cl.³ .............................................. H01L 41/08
[52] U.S. Cl. .................................. 310/311; 310/361; 29/25.35
[58] Field of Search .................. 310/311, 361, 357; 204/164, 157.1; 156/623 Q 361/233, 29/25.35

[56] References Cited

U.S. PATENT DOCUMENTS

| 2,898,243 | 8/1959 | Wenden | 310/361 X |
| 2,967,240 | 1/1961 | Koch | 310/361 X |
| 3,113,224 | 12/1963 | King | 310/361 |
| 3,288,695 | 11/1966 | King | 310/361 X |
| 3,337,439 | 8/1967 | Fraser | 310/361 X |
| 3,932,777 | 1/1976 | King | 310/311 |
| 4,255,228 | 3/1981 | Vig | 310/361 X |

Primary Examiner—Mark O. Budd
Attorney, Agent, or Firm—Nathan Edelberg; Jeremiah G. Murray; Roy E. Gordon

[57] ABSTRACT

An external source of electromagnetic energy is applied to quartz in addition to the conventional heating and DC bias electric field. The source can be either coherent or incoherent. The wavelengths can range from the infrared through the visible into the ultraviolet.

17 Claims, 1 Drawing Figure

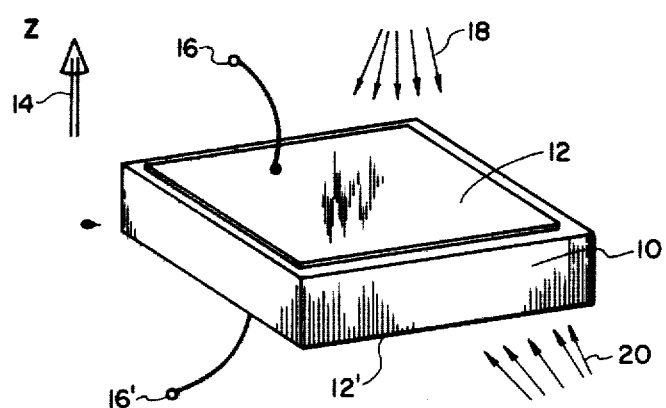

METHOD OF SWEEPING QUARTZ

The invention described herein may be manufactured, used and licensed by or for the Government for governmental purposes without the payment to us of any royalty thereon.

This invention relates in general to a method of sweeping quartz and in particular, to an improved method of sweeping quartz to a higher state of purity in a shorter time.

BACKGROUND OF THE INVENTION

Swept quartz generally refers to quartz treated by a method such as described in U.S. Pat. No. 3,932,777 issued to J. C. King on Jan. 13, 1976. This method comprises subjecting a quartz crystal to an electric field at an elevated temperature.

Briefly, it has been known heretofore that the presence of such impurities as sodium ions in alpha quartz is detrimental to the properties of crystal resonators made from the quartz. In order to "sweep" the quartz material substantially free of these impurities, it has been the practice to heat the material to somewhat below 573° C., the temperature at which the transition from alpha to beta quartz occurs. Then, a strong DC electric field, which typically ranges fron 500 volts per cm to six kilovolts per cm, has been applied substantially along the direction of the Z crystallographic axis of the quartz, and left on for several days. The field is kept on while the crystal cools to room temperature. The impurity ions are swept toward the cathode electrode. At the end of the process, a portion of the quartz contiguous to the cathode is removed and discarded and the remaining material is used to make crystal resonators that are substantially insensitive to the effects of radiation in the form of x-ray, gamma ray, electrons, etc.

Though the "sweeping" process has resulted in quartz that is relatively free from impurities, it would be desirable to "sweep" quartz to an even higher degree of purity in a shorter time.

SUMMARY OF THE INVENTION

The general object of this invention is to provide an improved method of sweeping quartz. A particular object of the invention is to provide such a method in which quartz is swept to a higher state of purity in a shorter time.

It has now been found that the foregoing objects can be attained by applying an external source of electromagnetic energy to the quartz in addition to the conventional heating and DC bias electric field.

The source of electromagnetic (EM) radiation can be coherent as for example, lasers or light emitting diodes or the source of EM radiation can be incoherent as for example, gas discharge lamps.

The source of radiation as for example infrared or ultraviolet may be used alone or together with another source of radiation, as for example, UV with IR or two or more UV sources of different spectral distributions.

The source or sources of EM radiation may be of fixed spectral distribution such as a mercury vapor lamp to produce UV, or may be of tunable spectral distribution such as a tunable laser, or may emit a continuum of wavelengths, such as deuterium filled arc lamps.

The effect of the radiation on the "sweeping" process is believed to be as follows. The crystal lattice vibrations occur substantially in the IR band of frequencies. Stimulation of the crystal with EM radiation in this frequency band sets the lattice in mechanical motion and this motion provides a stimulus to the impurity species to migrate and defects to repair under the influence of the DC "sweeping" field.

The vibrations of impurity and defect species trapped within the crystal occur substantially in the UV band of frequencies. Stimulation of the crystal with UV light in this frequency band sets the impurity and defect species in mechanical motion within the crystal and provides a stimulus to the impurities to migrate and defects to repair under the influence of the DC "sweeping" field.

DESCRIPTION OF THE DRAWING

The invention can best be understood by referring to the accompanying drawing which shows a crystalline quartz section to be swept and irradiated with an external source of EM energy according to the invention.

Referring to the drawing, a crystalline quartz section 10 is shown bearing a metallic electrode 12 on its top surface and a metallic electrode 12' on its bottom surface. The "Z" crystallographic axis of the section 10 is designated by the arrow 14, the "Z" axis being perpendicular to the major faces of section 10. An electrical connection 16 is provided to electrode 12 and an electrical connection 16' is provided to electrode 12' for the purpose of applying electric voltage to produce an electric sweeping field within section 10. A source or sources of coherent or incoherent EM radiation 18 is adapted to impinge on section 10 in a direction substantially parallel to the "Z" axis 14. A source or sources of coherent or incoherent EM radiation 20 is adapted to impinge on section 10 in a direction substantially perpendicular to the Z crystallographic axis 14. By "substantially", it is meant that it is not necessary for the DC biasing electric field, or the EM radiation to be exactly along the axis specified, but only that the field have a component along that axis.

If desired, other EM radiation sources can be included to impinge on sides of section 10 either substantially parallel to the "Z" axis 14 or substantially perpendicular to the "Z" axis 14. In fact, a ring of radiation sources can be included around section 10.

DESCRIPTION OF THE PREFERRED EMBODIMENT

A quartz section such as 10 is brought to a temperature of at least 300° C., but less than 573° C., and subjected to a high D.C. sweeping voltage to produce an electric field of about 1 kV per cm within the quartz section.

Under these conditions, UV radiation from a deuterium arc lamp that is enclosed in a sapphire envelope or from a tunable UV laser is shined onto the quartz section perpendicular to the Z axis. At the same time, a tunable infrared (IR) laser is shined onto the quartz section perpendicular to the Z axis. The lasers serve to irradiate the entire sample being swept. As a result of the added EM radiations, the quartz section is swept to a higher state of purity in a shorter time. The DC electric biasing field and the UV and IR electromagnetic sources are kept on while the crystal cools to room temperature. The impurity ions are swept toward the cathode electrode. As the end of the process, a portion of the quartz contiguous to the cathode is removed and discarded and the remaining material is used to make crystal resonators that are insensitive to the effects of radiation in the form of x-ray, gamma ray, electrons, etc.

If lattice and impurity vibrations take place in the quartz over certain specific frequency bands, then EM radiation at frequencies other than these specific bands will be relatively ineffectual in producing the desired migration of impurities. Therefore, it is highly desirable to match the frequencies of the sources of EM radiation to the frequencies of the lattice and impurities in the quartz. As the exact frequencies of the lattice and impurities vibrations are unknown, it is desirable to effect the required simulation by a tuning action of the IR and UV sources across the known frequency bands. The EM sources can be programmed to vary continuously through their tuning range across the known IR and UV bands of interest. Alternatively, a tunable EM source can be made to impinge on one side of the crystal while a detector measures the transmitted radiation on the other side of the crystal. The EM source can thus be controlled to dwell at the wavelength where the transmission is minimum.

EXAMPLE 2

Platinum electrodes are deposited onto the Z surfaces of a quartz section having edges substantially along the X, Y and Z crystallographic axes of the quartz. A 1 kV/cm DC biasing electric field is applied to the electrodes. The quartz section is then heated at a rate less than 5° C. per minute to a temperature of about 450° C. and maintained at that temperature. A source of tunable UV radiation is directed onto the +X surface of the quartz section and a photodetector is located near the −X surface so as to receive this radiation after transmission through the quartz section. The source of UV radiation is tuned through 0.15 micrometer ($\mu$m) to 0.36 $\mu$m. In the vicinity of each wavelength where the transmission is minimum, the source is programmed to dwell until the transmission increases to a constant value. After this constant value is reached, the source is tuned in search of the next minimum at which wavelength the process is repeated. This continues until the said UV range is traversed. The process of so traversing the said wavelength range may then be repeated.

EXAMPLE 3

The method is the same as in Example 2 except that the source of tunable radiation is in the IR, and the range traversed is from about 1 $\mu$m to about 30 $\mu$m. Furthermore, if no increase in transmission is observed after a period of 1 hour at a given wavelength, the source is programmed to tune to the next transmission minimum.

EXAMPLE 4

The method is the same as in Example 2 except that in addition to the UV radiation, IR radiation is directed onto the Y surfaces.

If the source or sources of IR and UV are arranged to illuminate the entire volume of the sample being swept, the level of intensity of the illumination may be sufficient to effect the desired stimulation. On the other hand, if the sources are focused on a smaller volume within the sample, the attendant intensity will be greater, which may be advantageous in effecting stimulation. In this case, the source or sources can be programmed to sequentially impinge on smaller volumes within the sample.

The EM sources 18 and 20 may be used alone or concurrently.

If source 18 is used with conventional electrodes, little or no radiation will pass through to the sample 10 because conventional electrodes are normally thick enough to be opaque. If the electrodes 12 and 12' are made of a thin film of gold or platinum to form a "half-silvered mirror", then sufficient EM radiation can be made to impinge on sample 10. Such an arrangement is unnecessary when the EM source is substantially perpendicular to the "Z" crystallographic axis. Alternatively, in place of a thin electrode acting as a "half-silvered mirror", the electrode can be formed as a metallic net, or grid, having an array of openings to permit the EM radiation parallel to the "Z" axis to impinge on the sample.

It is considered preferable to keep the source or sources of radiation on throughout the sweeping process as this maximizes the opportunity for impurity species to be removed. Generally, the longer the sample is exposed to the EM radiation, the greater the impurity removal.

In carrying out the method of the invention it is necessary that the combination of temperature, DC bias field, and EM radiation source not supply enough energy to any portion of the quartz crystal to produce Dauphine (electrical) twinning in the quartz. This is also the reason for not heating the crystal to the alpha-beta transition point. That is, upon cooling, the crystal is always found to be twinned and not usable if it is heated beyond the alpha-beta point.

We wish it to be understood that we do not desire to be limited to the exact details described, for obvious modifications will occur to a person skilled in the art.

What is claimed is:

1. In a method of sweeping quartz wherein the quartz is heated to between 300° C. and 573° C. and a strong DC voltage applied for the purpose of transporting the ionized impurities, the improvement of supplying an external source of energy in the form of electromagnetic waves selected from at least one member of the group consisting of electromagnetic waves having wavelengths in the infrared range and electromagnetic waves having wavelengths in the ultraviolet range as to aid, very substantially, the release and transport of impurities, thereby sweeping the quartz to a higher state of purity in a shorter time.

2. Method according to claim 1 wherein the external source is selected from the group consisting of a coherent source and an incoherent source.

3. Method according to claim 2 wherein the external source is coherent.

4. Method according to claim 2 wherein the external source is incoherent.

5. Method according to claim 3 wherein the coherent source is a laser.

6. Method according to claim 3 wherein the coherent source is a light emitting diode.

7. Method according to claim 4 wherein the incoherent source is a gas discharge lamp.

8. Method according to claim 1 wherein electromagnetic radiation from more than one source is supplied to the quartz.

9. Method according to claim 1 wherein electromagnetic radiation from an external source is adapted to impinge on the quartz in a direction substantially parallel to the "Z" crystallographic axis of the quartz.

10. Method according to claim 1 wherein electromagnetic radiation from an external source is adapted to impinge on the quartz in a direction substantially perpendicular to the "Z" crystallographic axis of the quartz.

11. Method according to claim 1 wherein electromagnetic radiation from an external source is adapted to impinge on the quartz in a direction substantially parallel to the "Z" crystallographic axis of the quartz and wherein electromagnetic radiation from another external soruce is adapted to impinge on the quartz in a direction substantially perpendicular to the "Z" crystallographic axis of the quartz.

12. Method according to claim 1 wherein electromagnetic radiation from more than one external source is adapted to impinge on the quartz in a direction substantially parallel to the "Z" crystallographic axis of the quartz.

13. Method according to claim 1 wherein electromagnetic radiation from more than one external source is adapted to impinge on the quartz in a direction substantially perpendicular to the "Z" crystallographic axis of the quartz.

14. Method according to claim 1 wherein electromagnetic radiation from more than one external source is adapted to impinge on the quartz in a direction substantially parallel to the "Z" crystallographic axis of the quartz and wherein electromagnetic radiation from more than one external source is adapted to impinge on the quartz in a direction substantially perpendicular to the "Z" crystallographic axis of the quartz.

15. In a method of sweeping quartz wherein the quartz is heated between 300° C. and 573° C. and a strong DC voltage applied for the purpose of transporting the ionized impurities, the improvement of shining a tunable ultraviolet laser onto the quartz in a direction substantially perpendicular to the "Z" crystallographic axis of the quartz and at the same time shining a tunable infrared laser onto the quartz in a direction substantially perpendicular to the "Z" crystallographic axis of the quartz.

16. In a method of sweeping a quartz section having edges substantially along the X, Y, and Z crystallographic axis of the quartz and platinum electrodes deposited onto the Z surfaces of the quartz, wherein the quartz is heated to about 450° C. and a strong DC voltage applied for the purpose of transporting the ionized impurities, the improvement of positioning a photodetector near the $-X$ surface of the quartz section and directing a source of tunable UV radiation onto the $+X$ surface in such a manner that the photodetector receives this radiation after transmission through the quartz section, wherein the source of UV radiation is tuned through 0.15 $\mu$m, to 0.36 $\mu$m and wherein in the vicinity of each wavelength where the transmission is minimum, the source is programmed to dwell until the transmission increases to a constant value after which the source is tuned in search of the next minimum at which wavelength the process is repeated.

17. In a method of sweeping a quartz section having edges substantially along the X, Y and Z crystallographic axes of the quartz and platinum electrodes deposited onto the Z surfaces of the quartz, wherein the quartz is heated to about 450° C. and a strong DC voltage applied for the purpose of transporting the ionized impurities, the improvement of positioning a photodetector near the $-X$ surface of the quartz section and directing a source of tunable IR radiation onto the $+X$ surface in such a manner that the photodetector receives this radiation after transmission through the quartz section, wherein the source of IR radiation is tuned through about 1 $\mu$m to about 30 $\mu$m and wherein in the vicinity of each wavelength where the transmission is minimum, the source is programmed to dwell until the transmission increases to a constant value after which the source is tuned in search of the next minimum at which wavelength the process is repeated.

* * * * *